(12) United States Patent
Micciche et al.

(10) Patent No.: US 8,044,462 B2
(45) Date of Patent: Oct. 25, 2011

(54) PROCESS FOR MANUFACTURING A POWER DEVICE ON A SEMICONDUCTOR SUBSTRATE AND CORRESPONDING DEVICE

(75) Inventors: Monica Micciche, Enna (IT); Antonio Giuseppe Grimaldi, San Giovanni La Punta (IT); Luigi Arcuri, Misterbianco (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 790 days.

(21) Appl. No.: 12/029,935

(22) Filed: Feb. 12, 2008

(65) Prior Publication Data

US 2008/0169519 A1    Jul. 17, 2008

Related U.S. Application Data

(63) Continuation-in-part of application No. PCT/EP2006/007964, filed on Aug. 11, 2006.

(30) Foreign Application Priority Data

Aug. 12, 2005 (EP) ..................... 05425596

(51) Int. Cl.
*H01L 21/66* (2006.01)

(52) U.S. Cl. ................ 257/341; 438/138; 257/E21.427

(58) Field of Classification Search .................. 257/341, 257/335, 337, 338; 438/137, 138
See application file for complete search history.

(56) References Cited

U.S. PATENT DOCUMENTS

| | | | |
|---|---|---|---|
| 6,703,665 B1 * | 3/2004 | Nakamura | 257/341 |
| 2003/0148559 A1 | 8/2003 | Onishi et al. | 438/138 |

FOREIGN PATENT DOCUMENTS

| | | |
|---|---|---|
| EP | 0780897 A1 | 6/1997 |
| EP | 0975024 A2 | 1/2000 |
| EP | 1081768 A2 | 3/2001 |

* cited by examiner

*Primary Examiner* — Walter L Lindsay, Jr.
*Assistant Examiner* — Reema Patel
(74) *Attorney, Agent, or Firm* — Lisa K. Jorgenson; Allen, Dyer, Doppelt, Milbrath & Gilchrist, P.A.

(57) ABSTRACT

An electronic device includes a semiconductor substrate of a first conductivity type and a drain layer adjacent the semiconductor substrate and having a plurality of drains. The drain layer includes a first semiconductor layer of the first conductivity type adjacent the semiconductor substrate, and at least one second semiconductor layer of a second conductivity type adjacent the first semiconductor layer. Moreover, a plurality of first column regions of the first conductivity type extends through the at least one second semiconductor layer to contact the first semiconductor layer. A plurality of second column regions of the second conductivity type delimits the plurality of first column regions. Furthermore, a plurality of body regions of the second conductivity type are adjacent respective ones of the plurality of second column regions.

19 Claims, 6 Drawing Sheets

PROCESS FOR MANUFACTURING A POWER DEVICE ON A SEMICONDUCTOR SUBSTRATE AND CORRESPONDING DEVICE

CROSS-REFERENCE TO RELATED APPLICATIONS

This application is a continuation-in-part of International Application No. PCT/EP2006/007964, filed Aug. 11, 2006, the entire disclosure of which is incorporated herein by reference.

FIELD OF THE INVENTION

The present invention relates to a method of manufacturing a power device on a semiconductor substrate and corresponding device.

More specifically, the invention relates to a method of manufacturing a multi-drain power electronic device integrated on a semiconductor substrate of a first type of conductivity.

The invention also relates to a power electronic device integrated on a semiconductor substrate of a first type of conductivity comprising a drain semiconductor layer on the semiconductor substrate comprising a first semiconductor layer of the first type of conductivity formed on the semiconductor substrate.

The invention particularly, but not exclusively, relates to a method of manufacturing a multi-drain MOS transistor device and the following description is made with reference to this field of application by way of illustration only.

BACKGROUND OF THE INVENTION

As it is well known, power MOS devices with a breakdown voltage BV between 200 and 1000V have a high output resistance (Ron), mainly due to the resistance of the epitaxial drain layer which may be necessary to withstand high voltages, and which depends on the dopant concentration of the epitaxial layer itself.

However, the possibility is also known of obtaining power MOS devices with a low output resistance and a high breakdown voltage BV by modifying the epitaxial layer concentration.

A known MOS device meeting this need is shown in FIG. 1, globally indicated with 3. Such a MOS power device 3 is of the so called multi-drain type and it comprises a heavily doped semiconductor substrate 1, in particular of the N+ type, whereon a semiconductor epitaxial layer 2 of the same N type is formed.

The epitaxial layer 2 forms a common drain layer for a plurality of elementary units forming the MOS power device 3. Each elementary unit comprises a body region 4, in particular of the P type, formed on the epitaxial layer 2.

In the epitaxial layer 2, below each body region 4, there is a column region 5, in particular of the P type, which extends downwards for the whole thickness of the epitaxial layer 2 towards the semiconductor substrate 1.

In particular, each column region 5 is aligned and in contact with a respective body region 4 of an elementary unit of the MOS power device 3. Both the N epitaxial layer 2 of the MOS power device 3 and the column regions 5 have a constant concentration along their whole vertical extension. In particular, these column regions 5 are formed by means of P dopant implantation carried out in the epitaxial layer 2.

The MOS power device 3 also exhibits, inside the body regions 4, heavily doped source regions 6, in particular of the N type. A lateral channel region 6a of the power device 3 is then formed by a portion of the body regions 4 adjacent to the surface of the epitaxial layer 2, and between the source regions 6 and the epitaxial layer 2 itself.

The surface of the epitaxial layer 2 is then covered with a thin gate oxide layer 7 and with a polysilicon layer 8. Openings are provided in the polysilicon layer 8 and in the thin gate oxide layer 7 to expose portions of the surface of the epitaxial layer 2 aligned with each source region 6. An insulating layer 9 completely covers the polysilicon layer 8 and it partially covers the source regions 6, so as to allow a source metallic layer 10 to contact the source regions 6 and the body regions 4. A drain metallic layer 10A is also provided on the lower surface of the semiconductor substrate 1.

It is to be noted that the presence of the column regions 5 thus allows the reducing of the resistivity of the epitaxial layer 2 without decreasing the breakdown voltage BV of the MOS power device 3 as a whole. With this type of device, it is thus possible to reach a predetermined breakdown voltage BV with a resistivity of the epitaxial layer 2 lower than that used in conventional MOS devices, and, in consequence, to obtain power MOS transistors with reduced output resistance.

Moreover, as shown in FIG. 2, MOS power devices 3 formed by means of a plurality of elementary units provided with column regions 5 exhibit a breakdown voltage BV, when the resistance of the epitaxial layer 2, shown by the curve A, varies, and is lower than the so called silicon ideal limit, shown by the curve B.

To better understand the dynamics of these known devices, with reference to FIGS. 3 to 5, a method is now described by which the MOS power device 3 of the multi-drain type of FIG. 1 is formed.

In particular, on the heavily doped N+ semiconductor substrate 1 an epitaxial layer 2 is formed comprising, at the bottom, a first N epitaxial layer 2a with a dopant concentration corresponding to a resistivity $\rho$.

A first photolithographic mask is formed on the first epitaxial layer 2a wherein a plurality of openings are formed. Through these openings a first P dopant implant step is carried out for forming first implanted regions 5a, as shown in FIG. 3. As shown in FIG. 4, on the first epitaxial layer 2a, a second N epitaxial layer 2b is formed with a dopant concentration corresponding to the resistivity $\rho$.

A second mask is then formed on the second epitaxial layer 2b wherein a plurality of openings are formed aligned with the first implanted regions 5a. Through these openings a second P dopant implant step is carried out in the second epitaxial layer 2b for forming second implanted regions 5b.

It is possible to include any number of masking steps and subsequent dopant implantation for forming a plurality of aligned implanted regions that are placed in a succession of epitaxial layers overlapped onto each other.

As shown in FIG. 5, on the second epitaxial layer 2b, a third N epitaxial layer 2c is then formed, having a third dopant concentration corresponding to the resistivity $\rho$.

On the third epitaxial layer 2c, a third mask is then formed wherein a plurality of openings are formed aligned with the second implanted regions 5b. Through these openings a third P+ dopant implant step is then carried out in the third epitaxial layer 2c for forming the body regions 4 of the MOS power device 3, as shown in FIG. 1.

By means of a further masking step, a further N dopant implant step is then carried out in the third epitaxial layer 2c for forming source regions 6 of the MOS power device 3 inside the body regions.

A diffusion thermal process is then carried out to make the implanted regions 5a, 5b, the body regions 4, and the source regions 6 of the MOS power device 3 diffuse so that the implanted regions 5a, 5b form a single column region 5 aligned and in electric contact with the body region 4.

The process is then continued with conventional manufacturing steps including the formation of the thin gate oxide layer 7 and the polysilicon layer 8 on the surface of the epitaxial layer 2. Openings are then provided in the polysilicon layer 8 and in the thin gate oxide layer 7 until portions of the surface of the epitaxial layer 2 aligned with each source region 6 are exposed. The insulating layer 9 is formed until it completely covers the polysilicon layer 8 and partially covers the source regions 6, so as to allow a source metallic layer 10 formed on the MOS power device 3 to contact the source regions 6 and the body regions 4. A drain metallic layer 10A is finally formed on the back surface of the semiconductor substrate 1.

It is to be noted that the presence of the column regions 5 in contact with the body regions 4 empties the drain region 2, allowing the MOS power device 3 thus formed to withstand a predetermined voltage applied from the outside to the device even in the presence of high dopant concentrations on the epitaxial layer 2.

Moreover, the breakdown voltage BV the MOS power device 3 thus obtained succeeds in withstanding varies, being the resistivity in the epitaxial layer 2 equal with the dopant concentration in the column regions 5 (which are, in the example shown in FIGS. 1 and 3-5, of the P type).

However, the area occupied by the column regions 5, useful for the cut-off step, is not used during the conduction of the MOS power device 3: the lateral widening from the column regions 5 limits the electric performances in conduction of the MOS power device 3 thus formed.

The lateral extension and the shape of the column regions 5 is however determined by the temperature used in the diffusion thermal process for the formation of the column regions 5.

To reduce the width from the column regions 5, it is then helpful to contain the thermal balance during the diffusion thermal process, thus decreasing the lateral diffusion of the implanted regions 5a and 5b in the epitaxial layers. However, to make the thermal process with limited thermal budget diffusion allows the implanted regions 5a and 5b to form a single electrically continuous P column region 5, it is helpful to reduce the thickness of each single epitaxial layer 2a, 2b wherein each of such implanted regions 5a, 5b is formed. However, reducing the thickness of each single epitaxial layer 2a, 2b decreases the thickness of the drain region 2 and thus the final breakdown voltage BV the MOS power device 3 obtained can withstand.

Using thermal processes with reduced thermal budget and thus reduced thicknesses for the drain epitaxial layer 2, to obtain MOS power devices which can withstand a predetermined voltage equal to that which can be obtained with devices formed with greater thermal budgets, the number of the epitaxial layers forming the drain epitaxial layer 2 and the relevant implant steps forming the P column regions 5 is to be increased. This approach remarkably increases the manufacturing costs of the MOS power devices 3 thus formed.

Moreover, these power devices 3, in order to operate correctly, may include an edge structure connected to the device itself.

In fact it is known that during its cut-off operation, the drain region is depleted thus an electric field is present which may not have an uniform distribution, especially in correspondence with portions of edge of the device. This type of distribution implies the presence of higher electric field values in some regions rather than in others, mainly next to edge surfaces of the device.

Thus, to reduce the electric field value in the edge portion, an implanted dedicated region of P type is formed adjacent to the edge portion of the device 3 extending in depth along the whole drain layer 2 and which contributes to make the device 3 withstand a high voltage.

Although addressing the issue of reducing the electric field value in the edge portions of the power device 3, such solution includes a properly provided implantation step.

SUMMARY OF THE INVENTION

The technical issue underlying the present approach is that of devising a method of manufacturing a multi-drain power electronic device integrated on a semiconductor substrate, having such structural characteristics as to allow the obtainment of devices with low output resistances, contained sizes (and reduced pitch), and being particularly stable to overcome the limits still affecting the devices formed according to the prior art.

The present approach is that of a multi-drain power electronic device integrated on a semiconductor substrate comprising column regions of a first type of conductivity obtained epitaxially as well as regions of a second type of conductivity delimiting them obtained by means of implantation, wherein body regions of the power electronic device are formed inside the column regions of the first type of conductivity.

On the basis of such an approach, a method of manufacturing an electronic device comprises forming a first semiconductor layer of a first conductivity type adjacent a semiconductor substrate and forming at least one second semiconductor layer of a second conductivity type adjacent the first semiconductor layer.

Moreover, in the at least one second semiconductor layer, a plurality of first regions of the first conductivity type may be formed. Additionally, a plurality of body regions of the second conductivity type may be formed in a portion of the second semiconductor layer free from the plurality of first regions.

A thermal diffusion process may be performed so that the plurality of first regions form a plurality of first column regions of the first conductivity type through the at least one second semiconductor layer and in contact with the first semiconductor layer. The plurality of first column regions may delimit a plurality of second column regions of the second conductivity type, with the plurality of body regions being formed in respective ones of the plurality of second column regions.

Another aspect is directed to an electronic device including a semiconductor substrate of a first conductivity type and a drain layer adjacent the semiconductor substrate and having a plurality of drains. The drain layer may include a first semiconductor layer of the first conductivity type adjacent the semiconductor substrate, and at least one second semiconductor layer of a second conductivity type may be adjacent the first semiconductor layer.

Moreover, a plurality of first column regions of the first conductivity type may extend through the at least one second semiconductor layer to contact the first semiconductor layer. A plurality of second column regions of the second conductivity type may delimit the plurality of first column regions. Furthermore, a plurality of body regions of the second conductivity type may be adjacent respective ones of the plurality of second column regions.

The characteristics and advantages of the methods and device according to the approach will be apparent from the following description of an embodiment thereof given by way of indicative and non limiting example with reference to the annexed drawings.

DETAILED DESCRIPTION OF THE PREFERRED EMBODIMENTS

With reference to such figures, the method for manufacturing a multi-drain power electronic device integrated on a semiconductor substrate and the relevant device is described.

The method described hereafter may not form a complete flow of the manufacturing method of integrated circuits. The approach can be put into practice together with the manufacturing techniques of the integrated circuits currently used in the field, and in the description only those commonly used steps being helpful for the comprehension of the present approach are included.

The figures showing cross sections of portions of an integrated electronic device during the manufacturing are not drawn to scale, but they are instead drawn so as to show the important characteristics of the approach.

Figure 1:
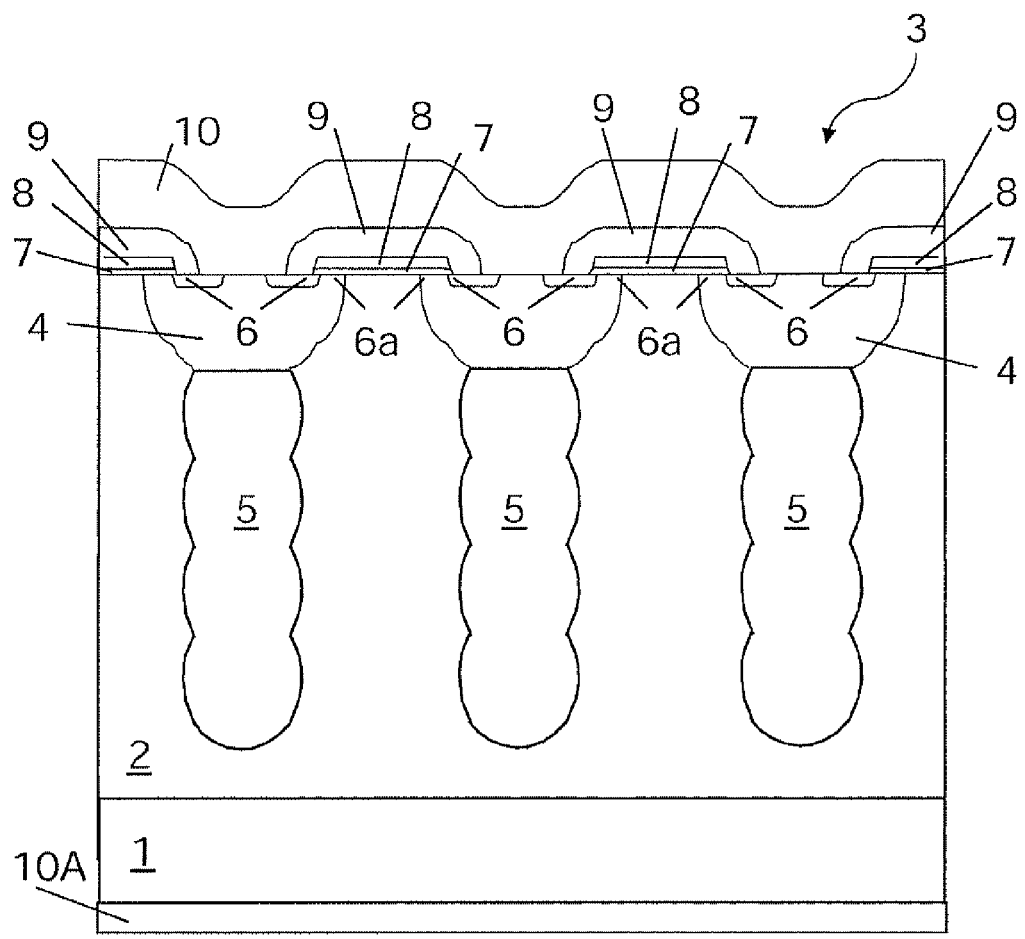
FIG. 1 is a section view of a multi-drain power MOS transistor in accordance with the prior art.
Figure 2:
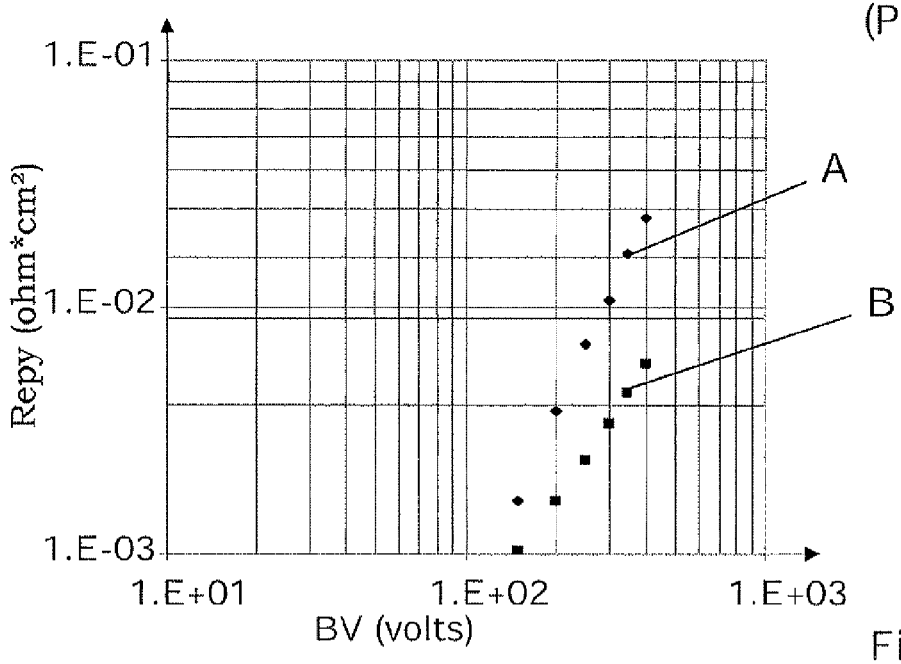
FIG. 2 shows the trend of the breakdown voltage BV for multi-drain MOS power devices, curve A, and for the silicon ideal limit, curve B, when the epitaxial layer resistance varies, in accordance with the prior art.
Figure 3:
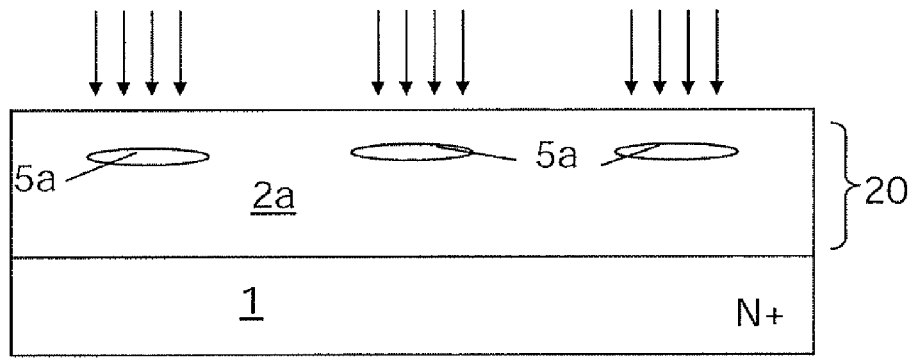
FIGS. 3 to 5 show vertical section views of a multi-drain power device during manufacturing steps of the method in accordance with the prior art.
Figure 4:
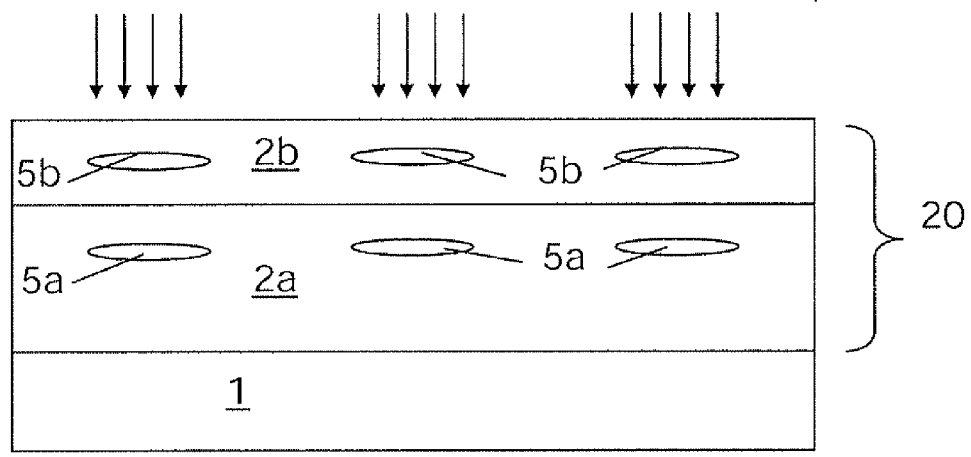
Figure 5:
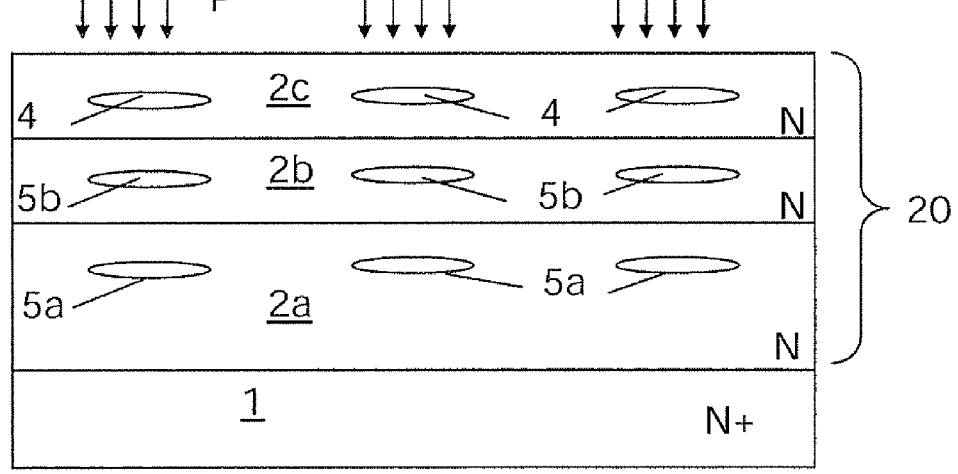
Figure 6:
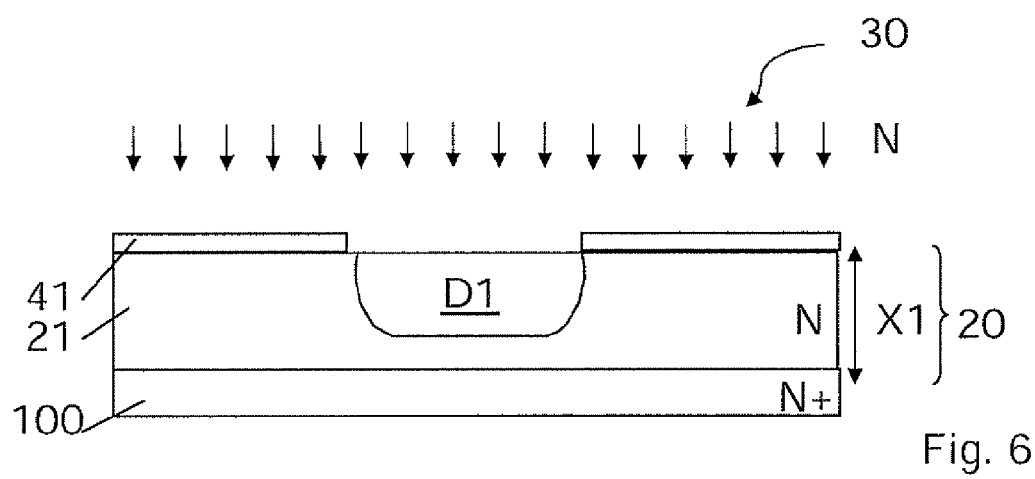
FIGS. 6 to 8 show vertical section views of a multi-drain power device during manufacturing steps of the method, according to the present invention.
Figure 8:
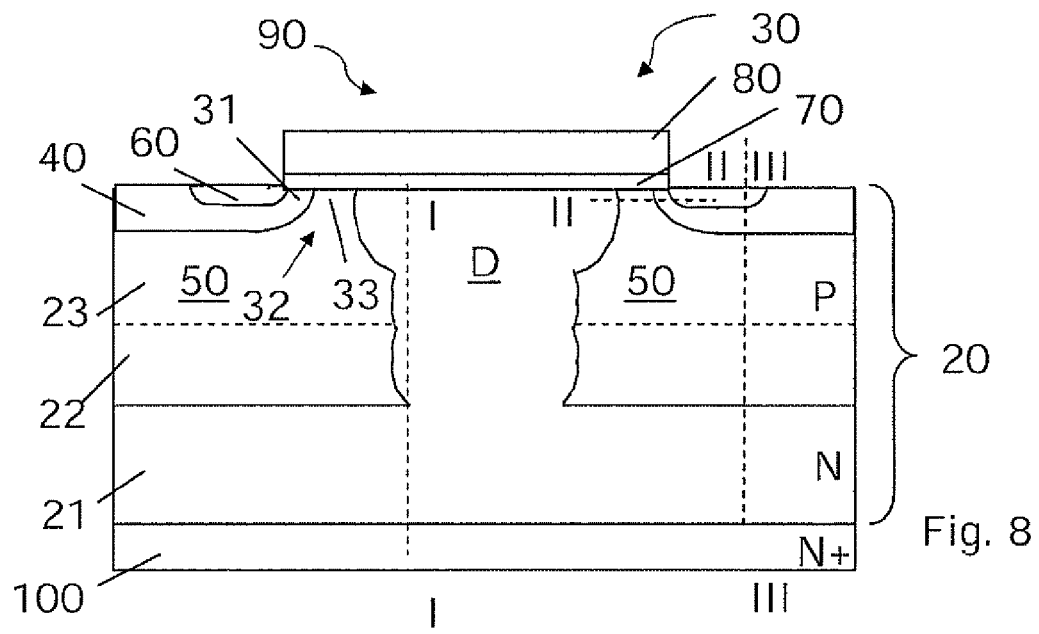

With reference to FIGS. 6 and 8, a method for manufacturing a power electronic device, in particular for manufacturing a multi-drain power MOS device, globally and schematically indicated with 30, is now described.

As shown in FIG. 6, on a semiconductor substrate 100 of a first type of conductivity, for example of the N+ type, a drain semiconductor layer 20 is formed comprising a first N semiconductor layer 21, for example grown by epitaxy on the semiconductor substrate 100, having a resistivity $\rho_1$ (for example comprised between 0.5 and 2 ohm*cm) and a first thickness X1 (for example, between 2 and 20 μm).

Advantageously, a first photolithographic mask 41 is formed on the first semiconductor layer 21, wherein a first plurality of openings are formed. Through these openings, a first N dopant implant selective step is carried out for forming by means of a successive diffusion process, first implanted regions D1.

The first dopant implant selective step is carried out with a first N implant dose $\Phi_1$, for example between $5 \times 10^{11}$ and $5 \times 10^{13}$ at/cm$^2$, and an implant energy between 100 and 800 keV. Advantageously, a pre-oxidation step may be carried out prior to the first implant selective step.

Figure 7:
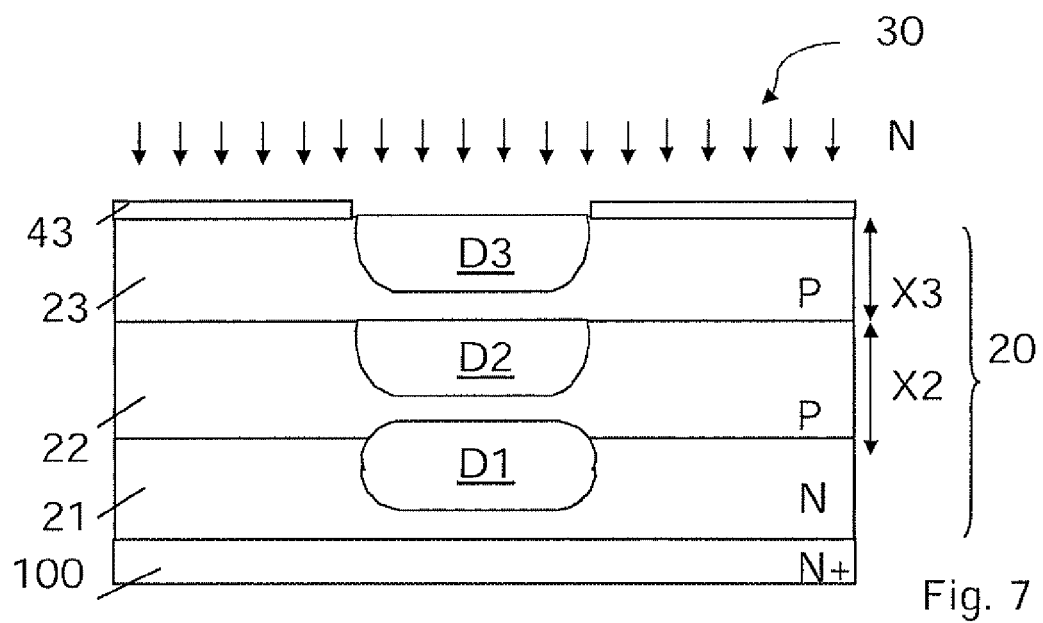

According to the method, once the first mask 41 is removed, as shown in FIG. 7, on the first semiconductor layer 21 a second semiconductor layer 22 of a second type of conductivity is formed, for example of the P type grown by epitaxy, with a resistivity equal to $\rho_2$ (for example between 0.5 And 2 ohm*cm) and with a second thickness X2 (for example between 2 And 10 μm).

A second photolithographic mask is then formed, not shown in the figures, wherein a second plurality of openings are formed aligned with the first plurality of openings, if these have been formed. Through these openings a second N dopant implant selective step is carried out to form, by means of a successive diffusion process, second implanted regions D2.

Advantageously, according to the method, the second N dopant implant selective step is carried out with a second implant dose Φ2 chosen so that the implanted N dopant concentration inverts the P dopant concentration of the second semiconductor substrate 22, and the implant energy used is, for example, between 100 and 800 keV, while the second dose Φ1 is, for example, between $5 \times 10^{11}$ and $5 \times 10^{13}$ at/cm$^2$.

In particular, when inside the drain semiconductor layer 20 this balance condition is formed between the dopant concentrations, the highest breakdown voltage BV the device 30 can withstand is obtained.

Once the second mask is removed, on the second semiconductor layer 22 a third P semiconductor layer 23 is formed, for example grown by epitaxy, with a resistivity equal to ρ3 (for example between 0.5 and 2 ohm*cm) and a third thickness X3 (for example between 2 and 10 μm).

Advantageously, the second and the third semiconductor layer 22, 23 have the same resistivity value. A third photolithographic mask 43 is then formed, wherein a third plurality of openings are formed aligned with the second plurality of openings. Through these openings a third N dopant implant selective step is carried out to form, by means of a successive diffusion process, third implanted regions D2.

Advantageously, the third dopant implant selective step is carried out with a third implant dose $\Phi_3$ chosen so that the implanted N dopant concentration inverts the P dopant concentration of the third semiconductor layer 23, and the implant energy used is, for example, between 100 and 800 keV, while the third dose $\Phi_3$ is, for example, between $5 \times 10^{11}$ and $5 \times 10^{13}$ at/cm$^2$.

A first diffusion thermal process is then carried out for completing the implanted regions D1, D2 and D3 so that the implanted regions D1, D2 and D3, by diffusing, form a plurality of column N electrically continuous implanted regions D which extend along the whole semiconductor layer 20 which comprises the first and the second and the third semiconductor layer 21, 22 and 23.

Figure 9:
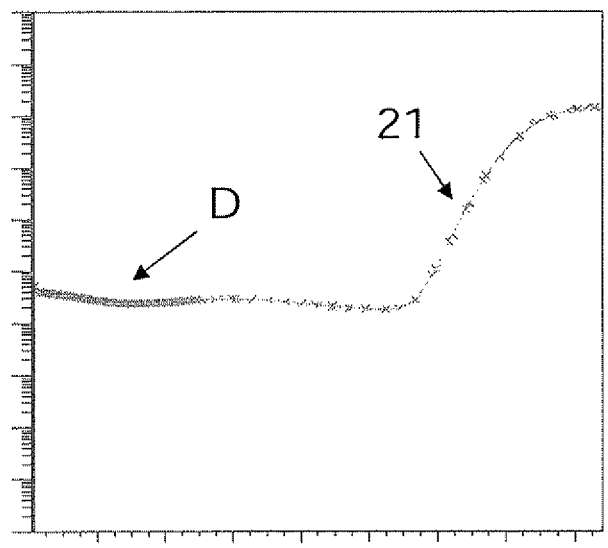
FIG. 9 shows a concentration profile of the multi-drain MOS power device of FIG. 8 along the line I-I.

The column regions D of N type have a constant concentration along their whole extension, as shown in FIG. 9, wherein the concentration of the column regions 5 is shown as a function of their thickness.

It thus follows that, as shown in FIG. 8, the continuous column implanted regions D of N type delimit column regions 50 of P type.

Thus the column regions 50 of P type are obtained from semiconductor layers, which, advantageously, are grown epitaxially, while the implanted regions D of N type delimiting them are obtained by means of diffusion of implanted regions in the semiconductor layers.

After having removed possible oxide layers still present on the last semiconductor layer, i.e. the third semiconductor layer 23, the method proceeds with the formation, on the surface of the drain semiconductor layer 20, of an insulating layer 70, for example a thin gate oxide layer and a conductive layer 80 for example of polysilicon.

By means of a photolithographic technique including the use of a further photolithographic mask, gate regions 90 are then formed by means of selective removal steps of the conductive layer 80 and of the insulating layer 70. Such gate regions 70 completely cover the column regions D of N type and they partially cover the column regions 50 of P type.

Such gate regions 90 act as a screening structure for portions of the semiconductor layer 23 during successive implantation steps.

Advantageously, the portions of the semiconductor layer 11 left exposed by the gate regions 90 have the shape of elementary strips, but they may be a polygonal shape or any other suitable shape.

A fourth P dopant implant selective step is then carried out to form, by means of a successive diffusion thermal process, body regions 40, to adjust the threshold voltage of the device 30, in portions of the second semiconductor layer 23 free from the implanted regions D3. The body regions 40 are thus formed inside the column regions 50 of P type formed by the second and third P semiconductor layer 22, 23. In a preferred embodiment such body regions 40 have the shape of elementary strips.

The fourth dopant implant selective step is carried out with a fourth P implant dose $\Phi_4$, for example, between $1\times10^{13}$ and $5\times10^{14}$ at/cm$^2$ and an implant energy between 60 and 200 keV, to adjust the device threshold voltage.

Advantageously, a fifth dopant implant selective step is carried out with a fifth P implant dose $\Phi_5$, for example, between $5\times10^{13}$ and $5\times10^{15}$ at/cm$^2$ and an implant energy between 60 and 200 keV, so as to make the device strong while switching A second diffusion thermal process is then carried out for completing the body regions 40 and make them diffuse below the gate regions 90. Portions of the body regions 40 below the gate region 90 form first portions 31 of lateral channel regions 32 of the device 30. Second portions 33 of the channel regions 32 are formed by a portion of the column regions 50 of P type comprised the body region 40 and the column region D of N type.

A further mask is then formed wherein a fourth plurality of openings are formed. Through these openings a sixth N dopant implant selective step is carried out for forming, by means of a successive diffusion process, source regions 60 inside the body regions 40.

Although in the method described different diffusion thermal processes are indicated, a single diffusion process may be carried out for completing the implanted regions formed.

Advantageously, by carrying out different diffusion thermal processes it is possible to optimize the thermal budgets in the method. The sixth N dopant implant selective step is carried out with a sixth implant dose $\Phi_6$, for example, between $2\times10^{15}$ and $5\times10^{15}$ at/cm$^2$ and an implant energy between 60 and 200 keV.

Figure 10:
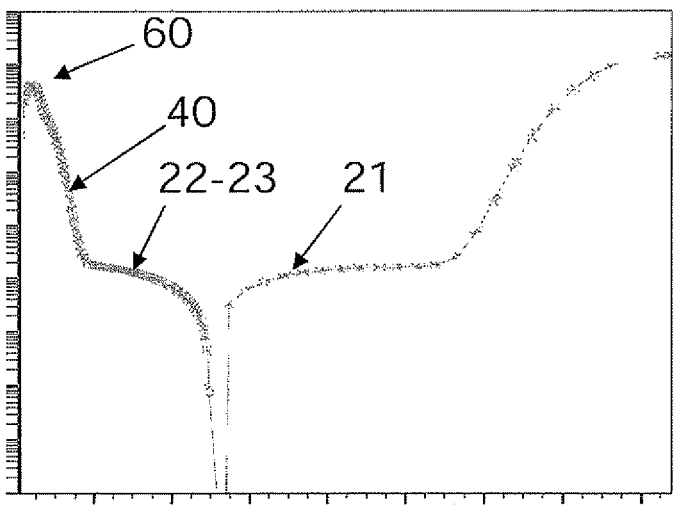
FIG. 10 shows a concentration profile of the multi-drain MOS power device of FIG. 8 along the line II-II.

FIG. 10 shows how the concentration varies inside the source regions 60, the underlying body regions 40, and the semiconductor layers 21, 22 and 23 as a function of their thickness.

The method of manufacturing the device 30 may be completed with conventional manufacturing steps including the formation of the metallizations.

In the description, specific reference has been made to column regions 50 being made of two P epitaxial semiconductor layers. However, the number of layers used can be different. Such number of semiconductor layers may depend on the breakdown voltage BV the final device 30 may withstand.

A device 30 formed according to the method, integrated on a semiconductor substrate 100 of a first type of conductivity, for example of the N type, comprises a drain semiconductor layer 20 formed on the semiconductor substrate 100.

The drain semiconductor layer 20 comprises in turn a first semiconductor layer 21 of N type formed on the semiconductor substrate 100 and at least a second semiconductor layer 23 of a second type of conductivity, for example of the P type, formed on the first semiconductor layer 21.

A first plurality of implanted column regions D of N type extend along the whole second semiconductor layer 23 until they contact the first semiconductor layer 21 and they delimit a second plurality of column regions 50 of N type.

Moreover, a plurality of body regions 40 of P type are formed in the plurality of column regions 50 of P type and a plurality of source regions 60 of N type are formed inside the body regions 40. The device 30 is then provided with gate regions 90 covering each region of the plurality of column regions D. Such gate regions 90 are also overlapped onto portions of the body regions 40, as well as substantially aligned with the source regions 60.

Thus, the device 30 may comprise a lateral channel region 32 between the source region 60 and the column region D of N type, which is formed by two portions: a first portion 31 being closer to the source region 60 formed by the portion of the body region 40 present below the gate region 90, and a second portion 33 which is made of a portion of the column region 50 of P type between the body region 40 and the column region D of N type. In particular, the portion of the column region 50 of P type between the body regions 40 and the column regions D of N type is the one being employed by the device 30 to withstand a high voltage.

Thus, the implant step for forming the body regions 40 has the function of adjusting a threshold voltage of the transistor 30 and not of completely forming the channel regions as it occurs for the devices 3 formed according to the approach.

It is thus helpful that the semiconductor layer 20 forms a common drain layer for a plurality of elementary units forming the MOS power device 30. Each elementary unit comprises a body region 40 below which there is a column region 50 of P type, which is delimited by pairs of implanted regions D which are obtained by means of diffusion of implanted regions in the semiconductor layers.

Figure 11:
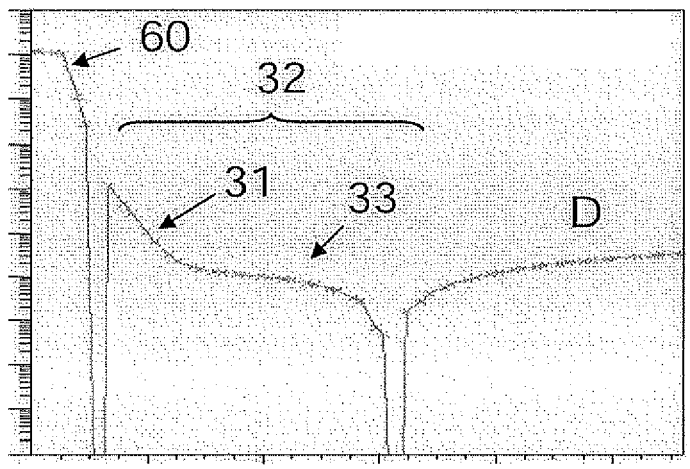
FIG. 11 shows a concentration profile of the multi-drain MOS power device of FIG. 8 along the line III-III.
Figure 12:
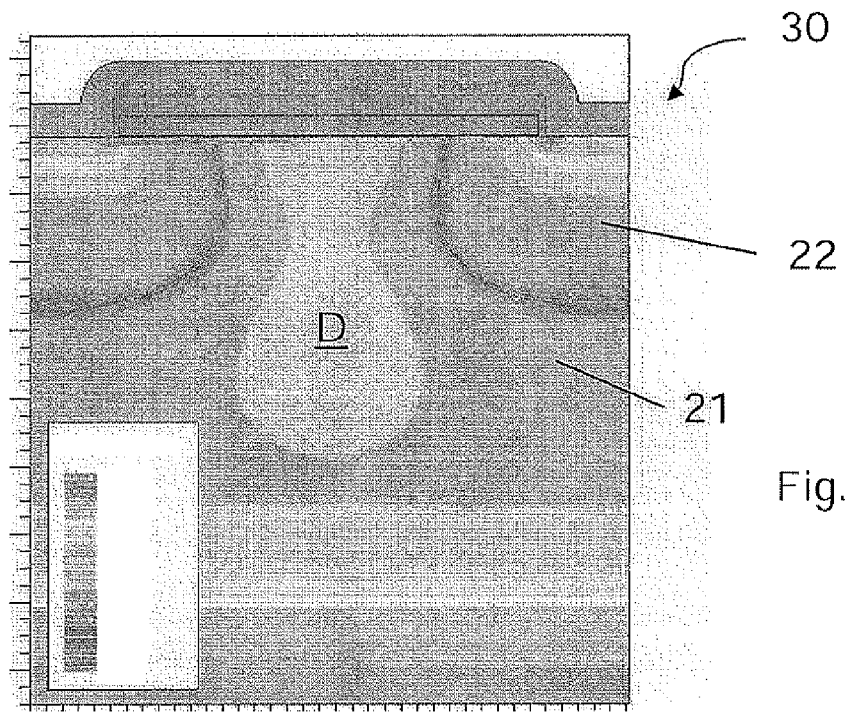
FIG. 12 shows a two-dimensional simulation of a multi-drain power MOS transistor manufactured with the method according to the present invention.
Figure 15:
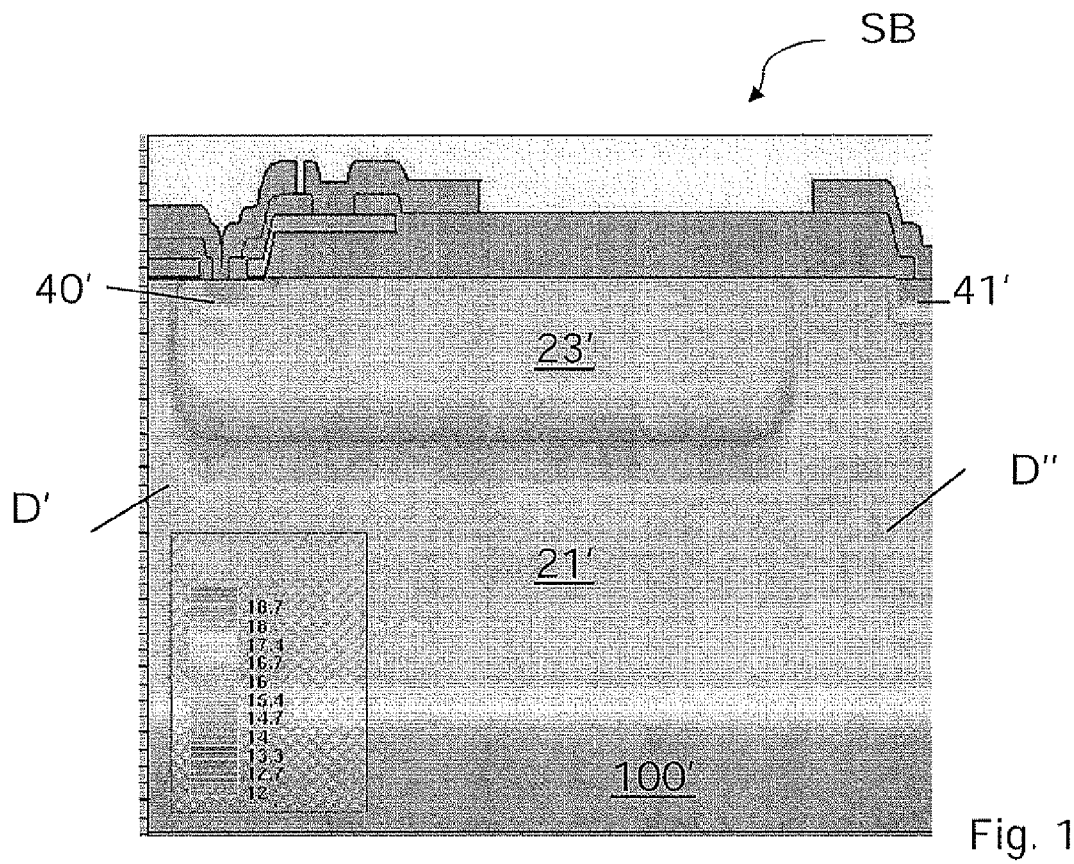
FIG. 15 shows a two-dimensional simulation of a portion of an edge structure formed according to the invention.

FIG. 11 shows the progress of the concentration along the channel region 32, while FIG. 12 shows a two-dimensional simulation of a multi-drain MOS transistor formed with a single P semiconductor layer. Although in the description specific reference has been made to an N channel multi-drain MOS transistor, a P channel multi-drain MOS transistor can be equally formed by inverting the two types of conductivity.

An edge structure SB is now described comprising at least a semiconductor layer 23', for example of the P type grown epitaxially, wherein the device 30 can be advantageously integrated.

Figure 13:
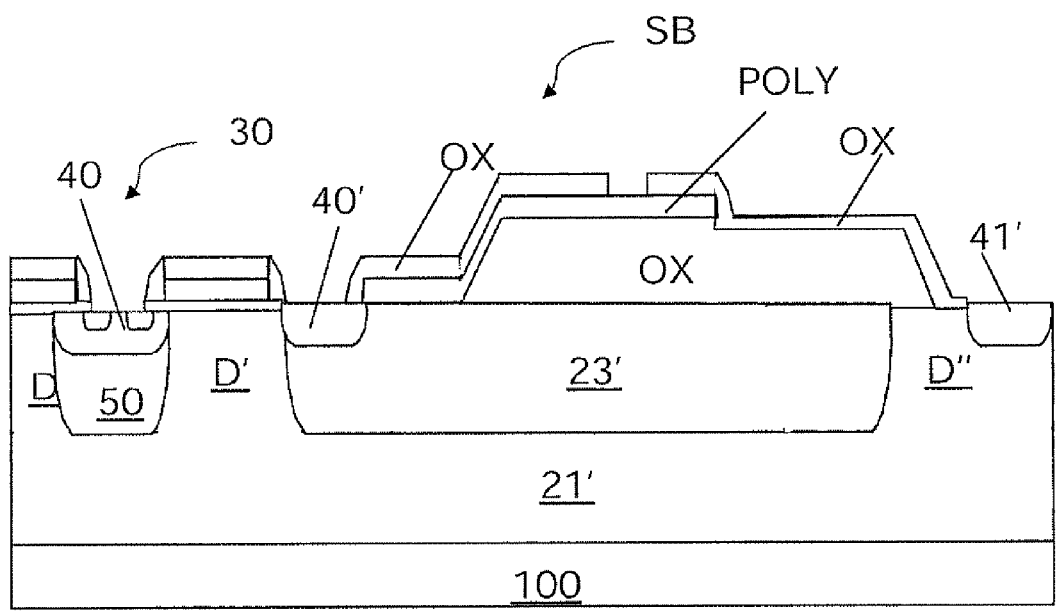
FIG. 13 is a section view of a portion of an edge structure integrated with a portion of a multi-drain power MOS transistor, according to the present invention.

In particular, the edge structure SB, shown in FIG. 13, comprises a first semiconductor layer 21' of a first type of conductivity, for example of the N type, above which at least the semiconductor layer 23' of a second type of conductivity is formed, for example of the P type, for example grown epitaxially. At least a pair of implanted regions D', D" of the N type delimits the edge structure SB.

The edge structure SB surrounds for example a device 30 formed as previously described and thus it results that the device 30 is completely surrounded by such semiconductor layer 23'.

Advantageously, the edge structure SB comprises at least a first P implanted annular region 40' formed in the semiconductor layer 23'.

A second implanted annular region 41' of N type can be formed in the implanted region D" outside the edge structure SB so as to surround it completely.

The edge structure SB may then be completed by overlapping insulating layers OX and conductive layers POLY which are formed on the surface of the semiconductor layer 23' so as to leave the implanted annular regions 40' and 41' exposed.

Advantageously, the semiconductor layers 21' and 23' of the edge structure SB coincide with the drain semiconductor layer 20 of the device 30 and they may be formed by the same method.

Figure 14:
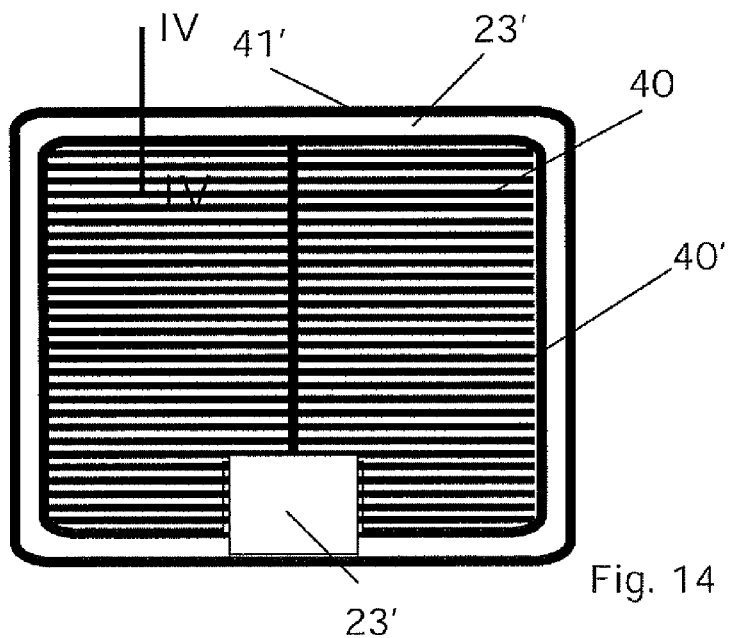
FIG. 14 is a top view of an edge structure formed according to the invention integrated with a multi-drain power MOS transistor formed according to the present invention.

Advantageously, as shown in FIG. 14, of which FIG. 13 is a section view along line IV-IV, first portions of the first implanted annular region 40' are parallel to body strips 40 forming the elementary cells of the device 30, while second portions of the first annular region 40' are in electric contact with such body strips 40.

Such an edge structure SB may not require the use of dedicated implantations as it instead occurs for edge structures SB formed according to the prior art, thus being particularly efficient.

In conclusion, in the device 30, the lateral extension of the column regions 50 of P type, which is a part that may not be used during the device 30 conduction, is remarkably reduced allowing the reduction of the sizes of the device itself, even in presence of thermal processes with a high thermal budget. Therefore, the power device 30 formed with the method exhibits a reduced output resistance being the height of the column regions 50 of P type equal with respect to a device formed according to the prior art.

Moreover, the device 30 has good static performances since the last P epitaxial semiconductor layer 23, wherein the body regions 40 are formed, has a sufficiently low dopant concentration to be depleted during the operation of the device 30 and thus may not increase the resistance of the channel region. Moreover, with each channel region 32 made of two portions 31 and 33 as described, the device 30 is particularly stable, therefore such a device may not have issues linked to the short channel effects.

Furthermore, a device 30 formed with the method is particularly simplified with respect to the devices 3 formed according to the prior art, allowing, with the breakdown voltage BV withstood by the final device being equal, the use of a lower number of semiconductor layers.

That which is claimed is:

1. A method of manufacturing an electronic device comprising:
    forming a first semiconductor layer of a first conductivity type adjacent a semiconductor substrate;
    forming at least one second semiconductor layer of a second conductivity type adjacent the first semiconductor layer;
    forming, in the at least one second semiconductor layer, a plurality of first regions of the first conductivity type;
    forming a plurality of body regions of the second conductivity type in a portion of the second semiconductor layer free from the plurality of first regions; and
    performing a thermal diffusion process so that the plurality of first regions form a plurality of first column regions of the first conductivity type through the at least one second semiconductor layer and in contact with the first semiconductor layer and so that the plurality of first column regions delimit a plurality of second column regions of the second conductivity type with the plurality of body regions being formed in respective ones of the plurality of second column regions.

2. A method according to claim 1, further comprising forming respective gate regions adjacent the at least one second semiconductor layer to cover respective ones of the plurality of first column regions and to partially cover respective ones of the plurality of second column regions so that, during the thermal diffusion process, the plurality of body regions diffuse below the respective gate regions and form first and second portions of channel regions that are defined by portions of the plurality of second column regions between the body regions and the plurality of first column regions.

3. A method according to claim 1, further comprising forming, in the first semiconductor layer, a plurality of second regions of the first conductivity type which, during the thermal diffusion process, contact the plurality of first column regions.

4. A method according to claim 1, wherein the at least one second semiconductor layer comprises a plurality of second semiconductor layers; wherein forming the plurality of first regions comprises forming same by a first selective implant with a first implant dose; and further comprising
    forming, in each layer of the plurality of second semiconductor layers, a respective plurality of third regions of the first conductivity type by performing a second selective implant step with a second implant dose, the respective plurality of third regions being aligned with the plurality of first column regions;
    the respective plurality of third regions forming, during the thermal diffusion process, the plurality of first column regions through the second plurality of semiconductor layers.

5. A method according to claim 4, wherein each of the plurality of second semiconductor layers has a same resistivity value.

6. A method according to claim 4, wherein the first implant dose and second implant dose balance a dopant concentration of corresponding layers of the plurality of second semiconductor layers where the plurality of second regions and the plurality of third regions are formed.

7. A method according to claim 4, wherein the first semiconductor layer and plurality of second semiconductor layers are formed epitaxially.

8. A method according to claim 4, wherein the first semiconductor layer and the plurality of second semiconductor layers have a thickness between 2 μm and 10 μm.

9. An electronic device comprising:
    a semiconductor substrate of a first conductivity type; and
    a drain layer adjacent the semiconductor substrate and having a plurality of drains, the drain layer comprising
        a first semiconductor layer of the first conductivity type adjacent the semiconductor substrate,
        at least one second semiconductor layer of a second conductivity type adjacent the first semiconductor layer, a plurality of first column regions of the first conductivity type extending through the at least one second semiconductor layer to contact the first semiconductor layer, a plurality of second column regions of the second conductivity type delimited by the plurality of first column regions, a plurality of body regions of the second conductivity type adjacent respective ones of the plurality of second column regions, and at least one third semiconductor layer of the second conductivity type positioned between the first semiconductor layer and the at least one second semiconductor layer and having a plurality of regions of the first conductivity type therein.

10. An electronic device according to claim 9, further comprising:

a plurality of gate regions covering respective ones of the plurality of first column regions and overlapping portions of the plurality of body regions;

the portions forming first portions of channel regions, second portions of the channel regions being formed by portions of the second column regions between the plurality of body regions and the first column regions.

11. An electronic device according to claim 9, wherein the first semiconductor layer and the at least one second semiconductor layer comprise epitaxial layers.

12. An electronic device comprising:

a semiconductor substrate of a first conductivity type; and an edge structure adjacent the semiconductor substrate, the edge structure comprising a first semiconductor layer of the first conductivity type adjacent the semiconductor substrate, at least one second semiconductor layer of a second conductivity type adjacent the first semiconductor layer, a pair of regions of the first conductivity type extending through the at least one second semiconductor layer to contact the first semiconductor layer and delimit the edge structure, and at least one multi-drain electronic device between the pair of regions.

13. An electronic device according to claim 12, wherein the first semiconductor layer and the at least one second semiconductor layer comprise epitaxial layers.

14. An electronic device according to claim 12, wherein the at least one second semiconductor layer includes an annular region therein.

15. An electronic device according to claim 14, wherein the annular region comprises a first portion and a second portion, the first portion being parallel to body strips of the multi-drain power electronic devices, the second portion being in electric contact with the body strips.

16. An electronic device according to claim 12, wherein a drain semiconductor layer of at least one of the multi-drain power electronic devices comprises the first semiconductor layer and the at least one second semiconductor layer adjacent thereto.

17. An electronic device according to claim 16, wherein at least one of the multi-drain power electronic devices comprises:

a plurality of first column regions of the first conductivity type extending through the at least one second semiconductor layer to contact the first semiconductor layer; and a plurality of second column regions of the second conductivity type having a plurality of body regions of the second conductivity type thereon.

18. An electronic device according to claim 17, wherein the drain semiconductor layer further comprises at least one third semiconductor layer of the second conductivity type having a plurality of regions of the first conductivity type therein, the plurality of regions being within the plurality of first column regions.

19. An electronic device according to claim 18, wherein at least one of the multi-drain power electronic devices further comprises:

a plurality of gate regions covering respective ones of the plurality of first column regions and having portions overlapping respective ones of the plurality of body regions;

the portions being positioned between respective ones of the plurality of body regions and respective ones of the first plurality of column regions.

* * * * *